(12) United States Patent
Nagami (10) Patent No.: US 10,170,150 B2
(45) Date of Patent: Jan. 1, 2019

(54) MEDIA PLAYBACK APPARATUS AND SHUTTER MECHANISM

(71) Applicant: MITSUBISHI ELECTRIC CORPORATION, Tokyo (JP)

(72) Inventor: Tetsuro Nagami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/741,139

(22) PCT Filed: Oct. 14, 2015

(86) PCT No.: PCT/JP2015/079015
§ 371 (c)(1),
(2) Date: Dec. 29, 2017

(87) PCT Pub. No.: WO2017/064765
PCT Pub. Date: Apr. 20, 2017

(65) Prior Publication Data
US 2018/0190320 A1 Jul. 5, 2018

(51) Int. Cl.
*G11B 33/02* (2006.01)
*G11B 17/051* (2006.01)
*G11B 25/04* (2006.01)
*H05K 5/02* (2006.01)

(52) U.S. Cl.
CPC ............ *G11B 17/051* (2013.01); *G11B 25/04* (2013.01); *G11B 33/02* (2013.01); *H05K 5/0217* (2013.01)

(58) Field of Classification Search
None
See application file for complete search history.

(56) References Cited

U.S. PATENT DOCUMENTS 6,671,245 B2* 12/2003 Wada ................. G11B 17/0405
720/657
2018/0240497 A1* 8/2018 Nagami ................. G11B 25/04

FOREIGN PATENT DOCUMENTS

| JP | 10247378 A | * | 9/1998 |
| JP | 11353862 A | * | 12/1999 |
| JP | 4598063 B2 | | 12/2010 |
| WO | WO 2006/106648 A1 | | 10/2006 |

* cited by examiner

*Primary Examiner* — William J Klimowicz
(74) *Attorney, Agent, or Firm* — Birch, Stewart, Kolasch & Birch, LLP (57) ABSTRACT

An arm (5) is provided with protrusions (56a, 56b) disposed between a spring (7) and the arm (5) and biasing the spring (7) away from a shutter (2) when the shutter (2) is disposed at either one of two positions, a closed position and an open position. This prevents natural vibration of the spring (7) due to extension of the spring (7), thereby preventing noise.

4 Claims, 7 Drawing Sheets

MEDIA PLAYBACK APPARATUS AND SHUTTER MECHANISM

TECHNICAL FIELD

This disclosure relates to a media playback apparatus with a shutter mechanism for preventing intrusion of foreign objects from an insertion slot through which a medium, such as a compact disc (CD), is to be inserted.

BACKGROUND ART

An example shutter mechanism is an opening/closing device disclosed in Patent Literature 1. The opening/closing apparatus includes two linkage members composed of thin metal plates. One end of each linkage member has a through-hole through which the external thread of a fixing bolt passes. The linkage members are fixed to a slidable chassis such that the linkage members are rotatable around their one end. The other ends of the two linkage members are rotatably and slidably connected to each other such that the linkers shift in the longitudinal direction relative to each other. A spring is stretched between the other ends of the linkage members. The spring biases the two linkage members to bring the other ends of the linkage members close to each other.

In the opening/closing apparatus, the external treads of the fixing bolts shift through the respective slide holes in the slidable chassis, the linkage members rotate relative to the slidable chassis around their one end, and the other ends of the linkers rotate and slide, to slide the slidable chassis relative to the front panel having an opening.

CITATION LIST

Patent Literature

[Patent Literature 1]
WO 2006/106648

SUMMARY OF INVENTION

Technical Problem

In the opening/closing apparatus according to Patent Literature 1, the spring is merely stretched between the other ends of the linkage members. Thus, the impact of the slidable chassis shifting to a closed position covering the opening or an open position exposing the opening causes the spring to vibrate at a natural frequency, generating noise such as chattering. External vibration can also cause natural vibration of the spring, leading to noise.

A possible measure to reduce the vibration of the spring is to urge a viscoelastic member, such as a cushion, against the spring. In general, the properties of a viscoelastic member significantly vary depending on temperature. The viscoelastic member cannot readily deform in a certain temperature range and urges the spring in a wrong direction. This causes the slidable chassis to unsmoothly shift or stop at a midway point. Repeated opening and closing operations cause the cushion to wear, thereby reducing the effect of vibration prevention.

An object of embodiments of this disclosure, which has been conceived to solve the problems described above, is to reduce noise through prevention of vibration of a spring stretched between two arms of a shutter mechanism.

The linkage members and the slidable chassis according to Patent Literature 1 are equivalent to the arms and shutter according to this disclosure.

Solution to Problem

A media playback apparatus according to this disclosure includes a panel having an insertion slot through which a medium is to be inserted; a base fixed to a rear face of the panel and comprising a pair of base slots, a pivot-axle projection, a guide projection, and a cam projection; a shutter comprising a pair of shafts engaging with the pair of base slots, wherein the shutter is configured to slide between a closed position and an open position in response to slide of the pair of shafts through the pair of base slots, the shutter covering the insertion slot at the closed position and exposing the insertion slot at the open position on a front face of the panel; a pair of arms, each arm having one end engaging with one of the pair of shafts and another end engaging with each other in such a manner that the arms move toward or away from each other; and a spring attracting the arms toward each other, wherein either or both of the pair of arms are provided with a pair of protrusions configured to be located between the spring and the corresponding arm to lift the spring away from the shutter at either the closed position or the open position of the shutter.

Advantageous Effects of Invention

According to this disclosure, a pair of protrusions is provided to be located between the spring and the arm to lift the spring away from the shutter at the closed position and the open position of the shutter. This causes the spring to come into contact with the protrusions to prevent natural vibration of the spring and thereby prevents noise, even in the case of swift shutting or opening of the shutter. The extension of the spring increases the force causing the shutter to be urged against the panel. This prevents shaking of the shutter even in the case of receiving external vibration, and thereby prevents noise caused by the shutter hitting the panel.

BRIEF DESCRIPTION OF DRAWINGS

FIGS. 13A and 13B illustrate a shutter mechanism according to a modification of the first embodiment.

DESCRIPTION OF EMBODIMENTS

To explain this disclosure in more detail, embodiments of this disclosure will now be described with reference to the accompanying drawings.

First Embodiment

Figure 1:
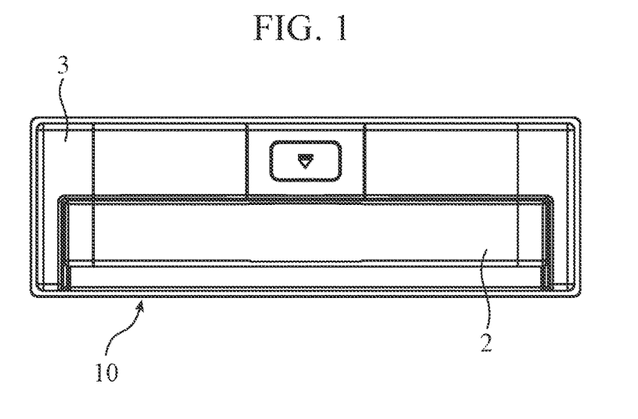
FIG. 1 is a front view of a media playback apparatus including a shutter mechanism according to First Embodiment of this disclosure, a shutter being at a closed position.
Figure 2:
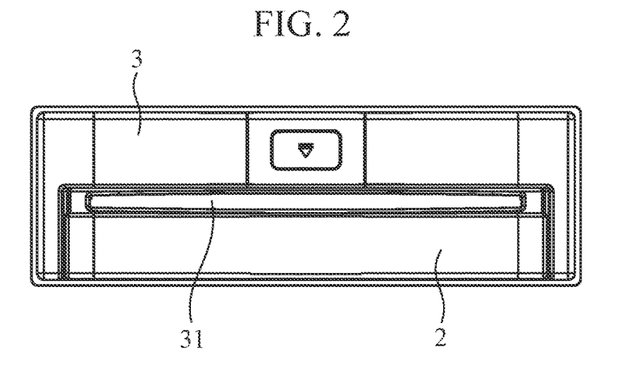
FIG. 2 is a front view of the shutter mechanism with the shutter at an open position.
Figure 3:
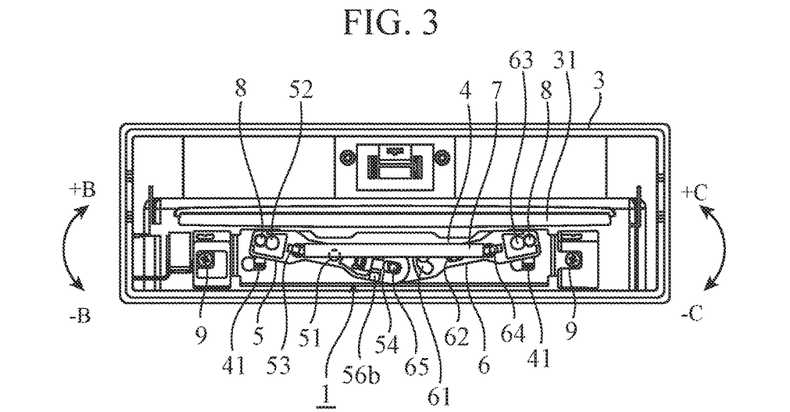
FIG. 3 is a rear view of the shutter mechanism with the shutter at the closed position.

FIG. 1 is a front view of a media playback apparatus 10 including a shutter mechanism 1 according to First Embodiment of this disclosure, in a situation in which a shutter 2 is at a closed position. FIG. 2 is a front view of the shutter mechanism 1 with the shutter 2 at an open position. FIG. 3 is a rear view of the shutter mechanism 1 with the shutter 2 at the closed position.

The front panel 3 of the media playback apparatus 10 has an insertion slot 31 through which a medium, such as a CD, is inserted or ejected, and two guide slots 32 extending in a direction the shutter 2 slides. The insertion slot 31 illustrated in the drawing is an opening through which a CD is inserted or ejected. The insertion slot 31 may be any other component, such as a connector for mating with a universal serial bus (USB) memory. The shutter 2 is disposed on the exterior of the panel 3 to prevent intrusion of foreign objects into the media playback apparatus 10 through the opening or to protect the connector.

Hereinafter, the position of the shutter 2 covering the insertion slot 31, i.e., the position of the shutter 2 in FIG. 1 is referred to as "closed position," and the position of the shutter 2 exposing the insertion slot 31, i.e., the position of the shutter 2 in FIG. 2 is referred to as "open position."

An example of using the shutter mechanism 1 for the media playback apparatus 10 will now be described, though the shutter mechanism 1 may be used for any other apparatus.

Figure 4:
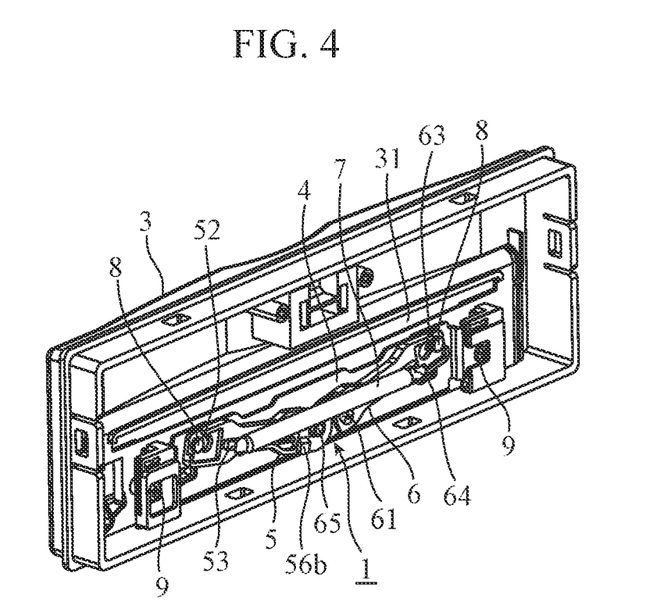
FIG. 4 is an external perspective rear view of the shutter mechanism with the shutter at the closed position.
Figure 5:
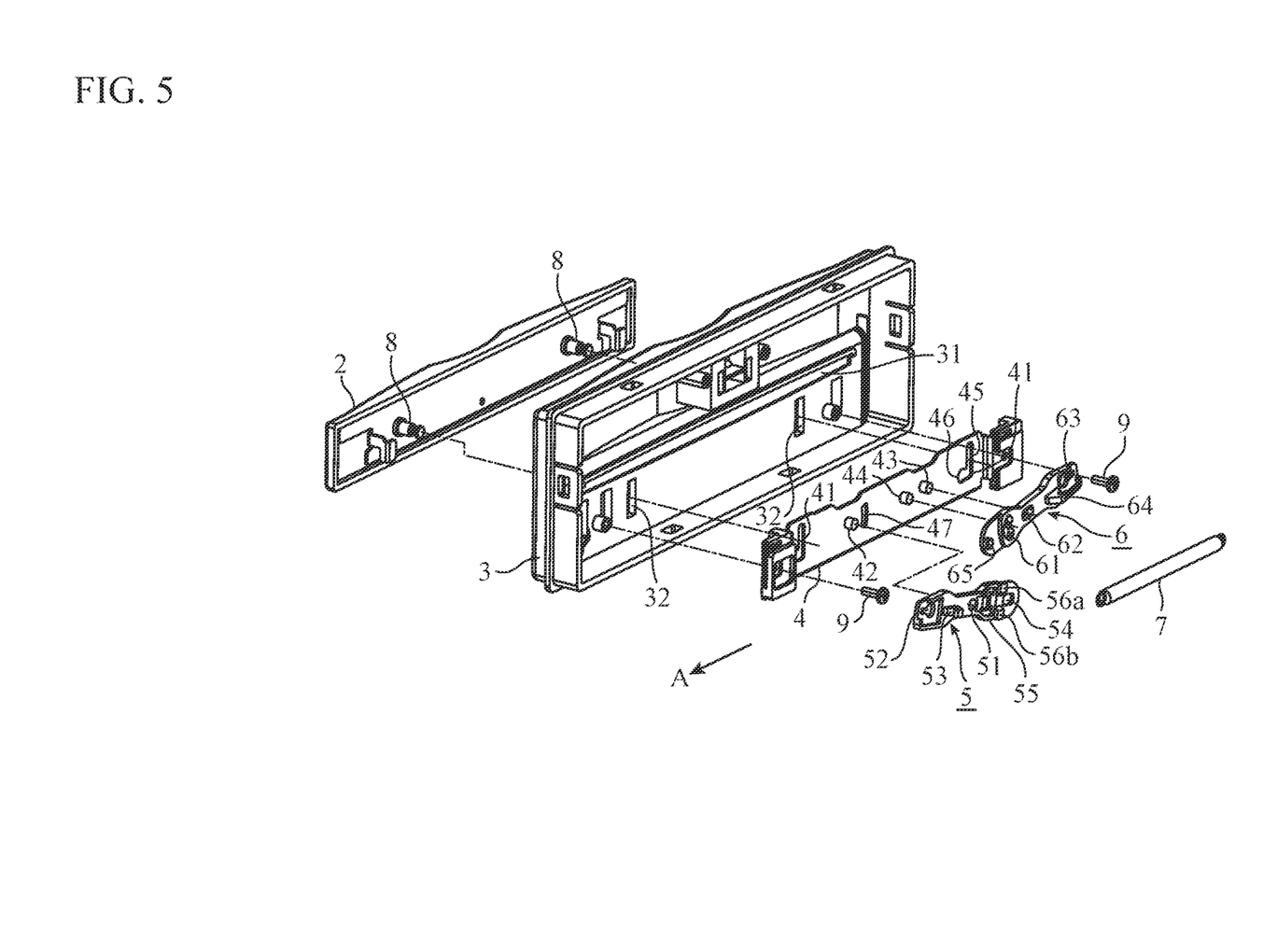
FIG. 5 is an exploded perspective rear view of the shutter mechanism.

FIG. 4 is an external perspective rear view of the shutter mechanism 1 with the shutter 2 at the closed position. FIG. 5 is an exploded perspective rear view of the shutter mechanism 1. The panel 3 includes a playback unit (not shown) for reading data stored on a medium, on the rear face.

The shutter mechanism 1 includes a shutter 2, a base 4, arms 5 and 6, and a spring 7. The arms 5 and 6 and the spring 7 constitute a linking mechanism that slides the shutter 2 from the open position to closed position and vice versa and holds the shutter 2.

Figure 6:
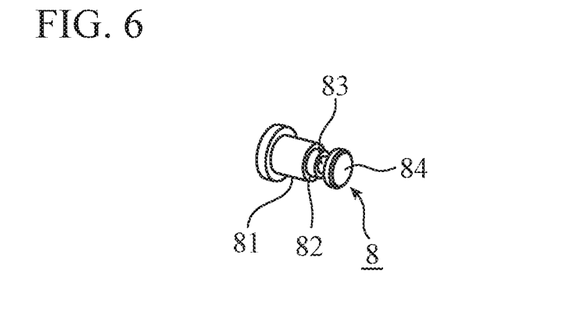
FIG. 6 is an enlarged external perspective view of a shaft disposed on the rear face of the shutter.

On the rear face of the shutter 2 there are fixed two shafts 8 to be inserted in the respective guide slots 32 of the panel 3 and respective base slots 41 of the base 4. FIG. 6 is an enlarged external perspective view of one of the shafts 8 on the rear face of the shutter 2. As illustrated in FIG. 6, the shaft 8 has a cylindrical portion 81, an intermediate diameter portion 82, a small diameter portion 83, and an end portion 84, in order from the base. The cylindrical portion 81 has a diameter slightly smaller than the width of the guide slot 32. The intermediate diameter portion 82 has a diameter smaller than that of the cylindrical portion 81. The small diameter portion 83 has a diameter smaller than that of the intermediate diameter portion 82. The end portion 84 has a diameter identical to that of the cylindrical portion 81. The cylindrical portions 81 of the respective shafts 8 engage with and slide along the respective guide slots 32 of the shutter 2, to cause the shutter 2 to slide relative to the panel 3 in the sliding direction of the guide slots 32. The cylindrical portions 81 come into contact with the ends of the respective guide slots 32 to bring the shutter 2 to the open or closed position.

On the rear face of the panel 3, the base 4 composed of a thin metal plate is fixed with two screws 9. The base 4 has the two base slots 41 that engage with the two shafts 8. The base slots 41 each has a slide portion 45 and a large diameter portion 46. The slide portion 45 faces the corresponding guide slot 32 and extends in the sliding direction of the shutter 2. The width of the sliding portion 45 is larger than the diameter of the intermediate diameter portion 82 of the shaft 8, but smaller than the diameter of the cylindrical portion 81. The large diameter portion 46 extends from an end of the slide portion 45 in the direction orthogonal to the sliding direction of the shutter 2. The diameter of the large diameter portion 46 is larger than that of the end portion 84 of the shaft 8. The base 4 includes a pivot-axle projection 42 functioning as a pivot axle of the arm 5, a guide projection 43 functioning as a guide for the rotation and shift of the arm 6 in the transverse direction (described below), and a cam projection 44 for engagement with a cam slot 61 in the arm 6. These components are formed on the base 4 by spinning. The base 4 has an arcuate slot 47 having a center at the pivot-axle projection 42.

The arms 5 and 6 are disposed on the rear face, facing the playback unit, of the base 4.

Figure 7A:
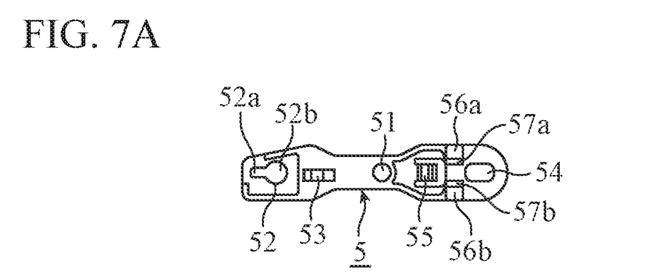
FIG. 7A is a rearview of one arm of the shutter mechanism.
Figure 7B:
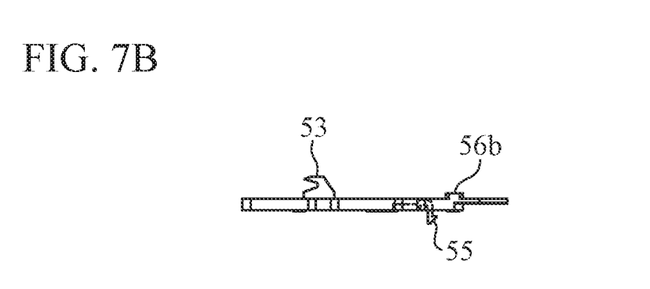
FIG. 7B is a plan view thereof.

FIG. 7A is a rear view of the arm 5. FIG. 7B is a plan view of the arm 5. The arm 5 is composed of a resin, such as polycarbonate (PC) or polyoxymethylene (POM). The arm 5 has a pivot-axle hole 51, a shaft engaging hole 52, a spring hook 53, an arm engaging hole 54, a hook 55, and protrusions 56a and 56b. The pivot-axle hole 51 engages with the pivot-axle projection 42 of the base 4. The shaft engaging hole 52 is disposed at one end of the arm 5. The shaft engaging hole 52, which has a key hole shape, has a rectangular portion 52a and a circular portion 52b and engages with the shaft 8. The width of the rectangular portion 52a is larger than the diameter of the small diameter portion 83 of the shaft 8, but smaller than the diameter of the intermediate diameter portion 82. The circular portion 52b has a diameter larger than that of the end portion 84 of the shaft 8. The spring hook 53 is disposed on the rear face of the arm 5 between the pivot-axle hole 51 and the shaft engaging hole 52. The spring hook 53 engages with and fixes one end of the spring 7. The long arm engaging hole 54 is disposed on the other end of the arm 5 (remote from the shaft engaging hole 52) and extends in the transverse direction in which the arms 5 and 6 move toward and away from each other. The arm engaging hole 54 engages with a protrusion 65 of the arm 6. The resilient hook 55 is disposed on the front face (adjacent to the base 4) of the arm 5 and engages with the arcuate slot 47. As illustrated in the drawing, the hook 55 achieves resilience by taking the form of a snap-fit joint.

The protrusion 56a is disposed on the rear face of the arm 5 and at a position in which the protrusion 56a overlaps with the spring 7 when the shutter 2 resides at the closed position. When the shutter 2 resides at the closed position, the protrusion 56a gets underneath the spring 7, more specifically between the spring 7 and the rear face of the arm 5, to lift the spring 7 away from the shutter 2 toward the playback unit.

The protrusion 56b is disposed on the rear face of the arm 5 at a position overlapping with the spring 7 when the shutter 2 resides at the open position. When the shutter 2 resides at the open position, the protrusion 56b comes underneath the spring 7 to bias the spring 7 toward the playback unit.

The inner faces of the protrusions 56a and 56b may have tapered portions 57a and 57b, respectively, each of the tapered portions 57a and 57b having a gradually increasing height from the rear face of the arm 5.

The tapered portion 57a comes into contact with the spring 7 that shifts in cooperation with the sliding motion of the shutter 2 from the open position to the closed position, and functions as a guide for the spring 7 to go up to the top of the protrusion 56a. The tapered portion 57b comes into contact with the spring 7 that shifts in cooperation with a sliding motion of the shutter 2 from the closed position to the open position, and functions as a guide for the spring 7 to go up to the top of the protrusion 56b.

Figure 8A:
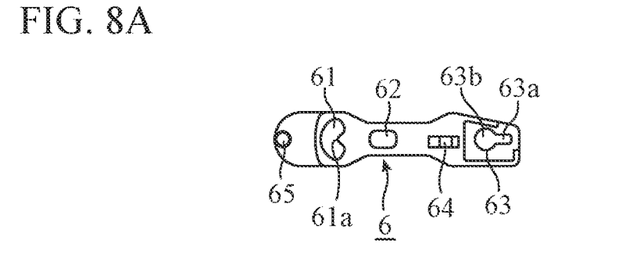
FIG. 8A is a rear view of the other arm of the shutter mechanism.
Figure 8B:
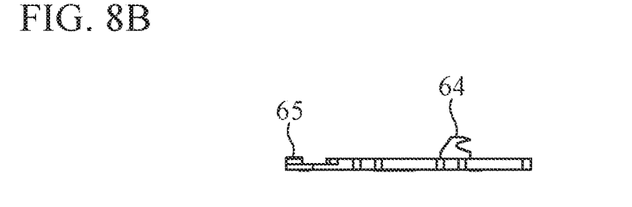
FIG. 8B is a plan view thereof.

FIG. 8A is a rear view of the arm 6; and FIG. 8B is a plan view of the arm 6. The arm 6 is also composed of a resin, like the arm 5. The arm 6 has a cam slot 61, an engage hole 62, a shaft engaging hole 63, a spring hook 64, and a protrusion 65. The cam slot 61 has a curved outline having a swell 61a protruding in a direction substantially orthogonal to the sliding direction of the shutter 2. The cam slot 61 engages with the cam projection 44 of the base 4. The long engage hole 62 extends in the transverse direction in which the arms 5 and 6 move toward or away from each other. The engage hole 62 engages with the guide projection 43 of the base 4 and functions as a guide for the arm 6 rotating or shifting in the transverse direction. The shaft engaging hole 63 is formed at one end of the arm 6. The shaft engaging hole 63, which has a key hole shape, has a rectangular portion 63a and a circular portion 63b and engages with the shaft 8. The width of the rectangular portion 63a is larger than the diameter of the small diameter portion 83 of the shaft 8, but smaller than the diameter of the intermediate diameter portion 82. The circular portion 63b has a diameter larger than that of the end portion 84 of the shaft 8. The spring hook 64 is disposed on the rear face of the arm 6 between the engage hole 62 and the shaft engaging hole 63. The spring hook 64 engages with and fixes the other end of the spring 7. The protrusion 65 is disposed at the end of the arm 6 remote from the shaft engaging hole 63 and engages with the arm engaging hole 54 in the arm 5.

The spring 7 is an extension spring. One end of the spring 7 is fixed to the spring hook 53 of the arm 5, and the other end is fixed to the spring hook 64 of the arm 6. By the spring 7, forces are exerted on the arms 5 and 6 in the direction such that the arms 5 and 6 are attracted toward each other.

The assembly process of the shutter mechanism 1 will now be described.

The shafts 8 fixed to the shutter 2 are inserted into the respective guide slots 32 in the panel 3 such that the shutter 2 is disposed at the open position. The shafts 8 extending through the guide slots 32 are fit to the respective large diameter portions 46 of the base slots 41 in the base 4. After the shafts 8 shift from the large diameter portions 46 to the respective slide portions 45 of the base slots 41 due to the slide of the base 4 in the direction A in FIG. 5, the panel 3 and the base 4 are fixed together with the screws 9. This fixes the shutter 2 on the front face of the panel 3 and the base 4 on the rear face of the panel 3. In this state, the guide slots 32 in the panel 3 engage with the cylindrical portions 81 of the respective shafts 8. The base slots 41 in the base 4 engage with the intermediate diameter portions 82 of the respective shafts 8. The base 4 is disposed between the cylindrical portions 81 and the end segments 84. The difference between the diameters of the cylindrical portions 81 and the end segments 84 and the width of the base slots 41 causes the shafts 8 to be fixed to the base 4 in this state.

The arm 6 is then fixed to the base 4. This is achieved by inserting the end segments 84 of the shafts 8 into the circular portions 63b of the respective shaft engaging holes 63 in the arm 6 and shifting the shafts 8 to the rectangular portions 63a by sliding the arm 6 in the direction A. The engage hole 62 engages with the guide projection 43 and the cam slot 61 engages with the cam projection 44, to fix the arm 6 to the base 4. In this state, the rectangular portions 63a of the arm 6 engage with the small diameter portions 83 of the respective shafts 8.

The arm 5 is then fixed to the base 4. This is achieved by inserting the end segments 84 of the shafts 8 into the circular portions 52b of the respective shaft engaging hole 52 in the arm 5 and shifting the shafts 8 to the rectangular portion 52a by sliding the arm 5 in the direction opposite to the direction A. The pivot-axle hole 51 engages with the pivot-axle projection 42, the arm engaging hole 54 engages with the protrusion 65, and the snap-fit joint hook 55 fits to the arcuate slot 47, to fix the arm 5 to the base 4. In this state, the rectangular portions 52a of the arm 5 engage with the small diameter portions 83 of the respective shafts 8.

The spring 7 is then fixed to the spring hook 53 of the arm 5 and the spring hook 64 of the arm 6, to complete assembly of the shutter mechanism 1.

In conventional processes, the arms 5 and 6 have been fixed to the base 4 with fastening members, such as a screw and an E-ring or cut washer, complicating assembly activity.

In contrast, in First Embodiment, the shaft engaging holes 52 and 63 engage with the small diameter portions 83 of the shafts 8, and the end segments 84 having a diameter larger than that of the small diameter portions 83 come into contact with the arms 5 and 6 around the shaft engaging holes 52 and 63, to prevent separation of the arms 5 and 6. The fixed arm 5 overlaps with the arm 6 to prevent separation of the arm 6. The arm 5 is fixed to the base 4 through the engagement of the snap-fit joint hook 55 with the arcuate slot 47. This provides the shutter mechanism 1 that can be readily assembled without a fastening member.

The operation of the shutter mechanism 1 will now be described.

Figure 9A:
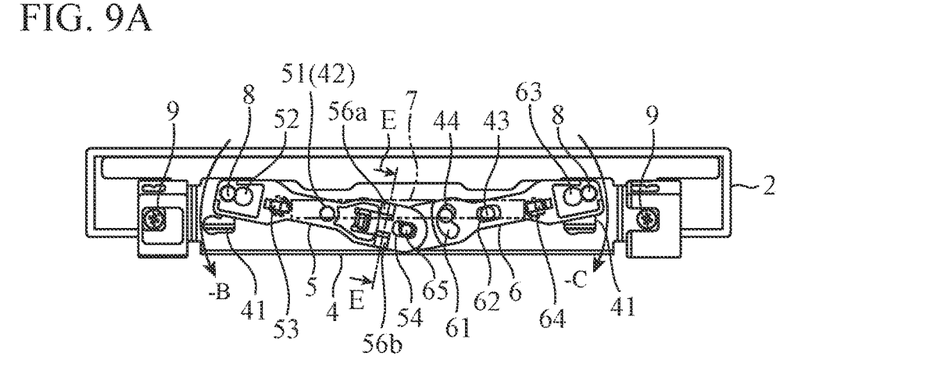
FIG. 9A is a rear view of the shutter mechanism with the shutter at the closed position.
Figure 9B:
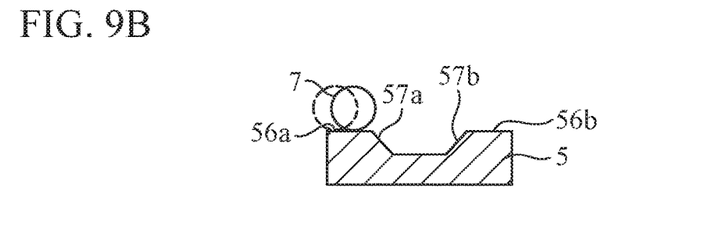
FIG. 9B is a cross-section of a spring and an arm taken along line E-E'.
Figure 10A:
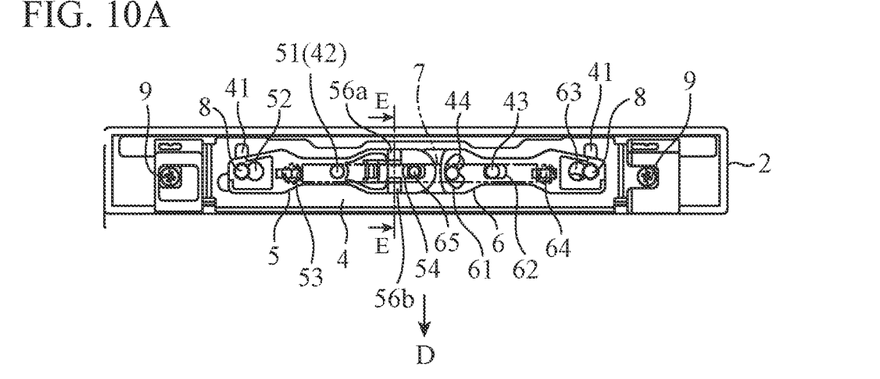
FIG. 10A is a rear view of the shutter mechanism with the shutter at a midway position.
Figure 10B:
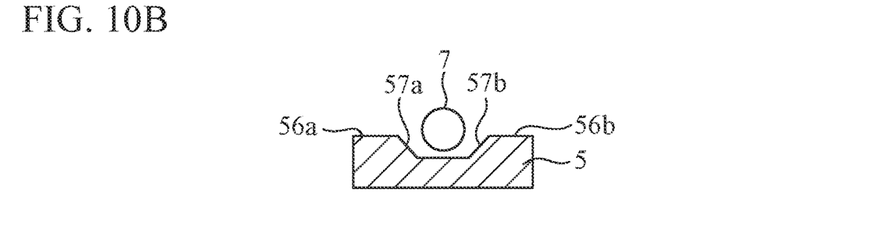
FIG. 10B is a cross-section of the spring and the arm taken along line E-E'.
Figure 11A:
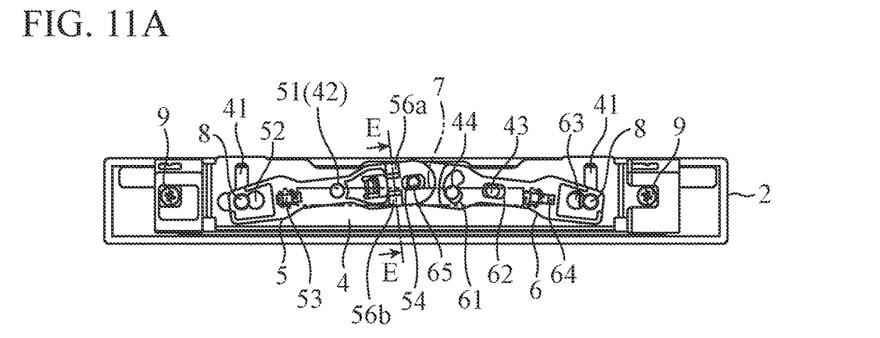
FIG. 11A is a rear view of the shutter mechanism with the shutter at the open position.
Figure 11B:
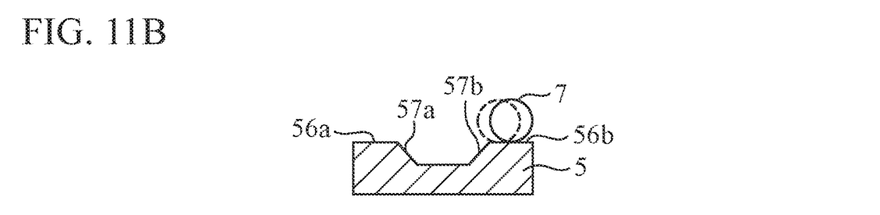
FIG. 11B is a cross-section of the spring and the arm taken along line E-E'.

FIG. 9A is a rear view of the shutter mechanism 1 with the shutter 2 at the closed position; and FIG. 9B is a cross-section of the spring 7 and the arm 5 taken along line E-E'. The dash line indicates a fluctuation in the position of the spring 7. FIG. 10A is a rear view of the shutter mechanism 1 with the shutter 2 at a midway position while sliding between the closed position and the open position; and FIG. 10B is a cross-section of the spring 7 and the arm 5 taken along line E-E'. FIG. 11A is a rear view of the shutter mechanism 1 when the shutter 2 resides at the open position; and FIG. 11B is a cross-section of the spring 7 and the arm 5 taken along line E-E'. The dash line indicates a fluctuation in the position of the spring 7. The panel 3 is not depicted in FIGS. 9 to 11.

In the closed state of the insertion slot 31 with the shutter 2 residing at the closed position, as illustrated in FIGS. 1, 3, and 9A, loads due to resilient forces of the spring 7 are applied in such a manner that the arms 5 and 6 are attracted toward each other. The load biases the arm 5 in the direction +B in FIG. 3 around the fulcrum at the pivot-axle hole 51 engaging with the pivot-axle projection 42 and the arm 6 in the direction +C in FIG. 3 around the fulcrum at the engage hole 62 engaging with the guide projection 43. The urging force applied to the shafts 8 causes the cylindrical portions 81 to be pressed against the ends of the respective guide slots 32, thereby biasing the shutter 2 toward the closed position.

The spring hooks 53 and 64 are disposed at outermost possible positions of the arms 5 and 6, respectively, and on the rear faces of the arms 5 and 6, respectively, remote from the shutter 2, not the front faces adjacent to the shutter 2. Such a structure causes the spring 7 to readily lift the arms 5 and 6 toward the playback unit with a pulling force, and thereby cause the shutter 2 to be pressed against the panel 3. This prevents shaking of the shutter 2 and thereby prevents noise caused by the shutter 2 hitting the panel 3 due to vibration.

The term "outermost possible position of the arm 5" refers to a position closer to the shaft 8 engaging with the shaft engaging hole 52 than the pivot-axle hole 51. The term "outermost possible position of the arm 6" refers to a position closer to the shaft 8 engaging with the shaft engaging hole 63 than the engage hole 62.

With reference to FIG. 9B, the protrusion 56a of the arm 5 moves into beneath the spring 7 and lifts the spring 7 toward the playback unit, causing the spring 7 to extend. This prevents natural vibration of the spring 7 even if the shutter 2 swiftly shuts and the shafts 8 forcefully slam into the ends of the guide slots 32, and thereby prevents noise. The shutter 2 pressing against the panel 3 with an increased force prevents the shaking of the shutter 2, and thereby prevents noise caused by the shutter 2 hitting the panel 3.

In order to insert a medium into the insertion slot 31 when the shutter 2 resides at the closed position, a user applies a force to the shutter 2 against the urging force applied to the shutter 2, to slide the shutter 2 in the direction of the open position. The sliding force applied to the shutter 2 by the user is applied to the arms 5 and 6 via the shafts 8. This causes the arm 5 in the state illustrated in FIG. 9A to rotate in the direction −B around the fulcrum at the pivot-axle hole 51 and the arm 6 to rotate in the direction −C around the fulcrum at the engage hole 62.

When the shutter 2 resides at the closed position, the load of the spring 7 causes the cam projection 44 of the base 4 to engage with the cam slot 61 at a position outward of the swell 61a, as illustrated in FIG. 9B. When the user slides the shutter 2 and the arm 6 rotates in the direction −C, the cam projection 44 shifts along the inclined edge of the swell 61a relative to the cam slot 61, as illustrated in FIG. 10B. As illustrated in FIG. 10A, the guide projection 43 relatively shifts in the long engage hole 62, and the arm 6 relatively shifts away from the arm 5, in other words, in a direction causing the extension of the spring 7. The spring 7 is extended to its maximum length immediately before the cam projection 44 moves over the swell 61a, and the reactive force of the spring reaches a maximum value. Thus, a force resisting the rotation of the arm 6 steeply increases from the beginning to the midway of the rotation of the arm 6, thereby increasing the force required for sliding the shutter 2. During the transition from the state in FIG. 9B to the state in FIG. 10B, the cam slot 61 functions as a cam biasing the arms 6 and 5 engaged with each other at the other ends toward the closed position. This generates a strong force that can hold the shutter 2 at the closed position.

Immediately after the cam projection 44 passes over the swell 61a, the cam projection 44 rapidly slides relatively along the swell 61a in the cam slot 61 in response to the restoring force of the spring 7, resulting in transition from the state in FIG. 10B to the state in FIG. 11B. Thus, the arm 6 rapidly rotates in the direction −C around the fulcrum at the engage hole 62. The arms 5 and 6 are linked through engagement of the arm engage hole 54 with the protrusion 65. This linkage causes the arms 5 and 6 to move substantially in axial symmetry. Thus, the arm 5 also rapidly rotates in the direction −B around the fulcrum at the pivot-axle hole 51 in response to the rapid rotation of the arm 6 in the direction −C. The shafts 8 engage with the arms 5 and 6 move through the guide slots 32 in the direction D, and, similarly, the shutter 2 moves to the open position. In response to the cylindrical portions 81 of the shafts 8 coming into contact with the ends of the guide slots 32, the shutter 2 stops at the open position to expose the insertion slot 31, as illustrated in FIGS. 2 and 11A.

When the shutter 2 slides from the closed position to the open position, the spring 7 moves along the tapered portion 57b of the arm 5 onto the protrusion 56b. At the open position of the shutter 2 as illustrated in FIG. 11A, the protrusion 56b gets underneath the spring 7 to lift the spring 7 toward the playback unit as illustrated in FIG. 11B. This prevents natural vibration of the spring 7 even if the shutter 2 swiftly opens and the shafts 8 forcefully slam into the ends of the guide slots 32, and thereby prevents generation of noise. The strong urging force of the shutter 2 against the panel 3 prevents the shaking of the shutter 2, and thus generation of noise.

When the shutter 2 resides at the open position, loads by the spring 7 are applied in such a manner that the arms 5 and 6 are attracted toward each other. Due to the loads, the arm 5 is biased in the direction −B in FIG. 3 around the fulcrum at the pivot-axle hole 51 engaging with the pivot-axle projection 42, while the arm 6 is biased in the direction −C in FIG. 3 around the fulcrum at the engage hole 62 engaging with the guide projection 43. The biasing forces applied to the shafts 8 cause the cylindrical portions 81 to be pressed against the ends of the respective guide slots 32, thereby biasing the shutter 2 toward the open position. The cam slot 61 functions as a cam biasing the arms 6 and 5 engaged with each other at their other ends toward the open position. This generates a strong force that holds the shutter 2 at the open position.

When the user slides the shutter 2 located at the open position toward the closed position against the urging force applied to the shutter 2, the arm 5 in the state illustrated in FIG. 11A rotates in the direction +B around the fulcrum at the pivot-axle hole 51 and the arm 6 rotates in the direction +C around the fulcrum at the engage hole 62. The direction of the operation of the shutter mechanism 1 during the shift of the shutter 2 from the open position to the closed position is opposite to the operation of the shutter mechanism 1 during the shift of the shutter 2 from the closed position to the open position; hence, the explanation on the operation is omitted.

Figure 12:
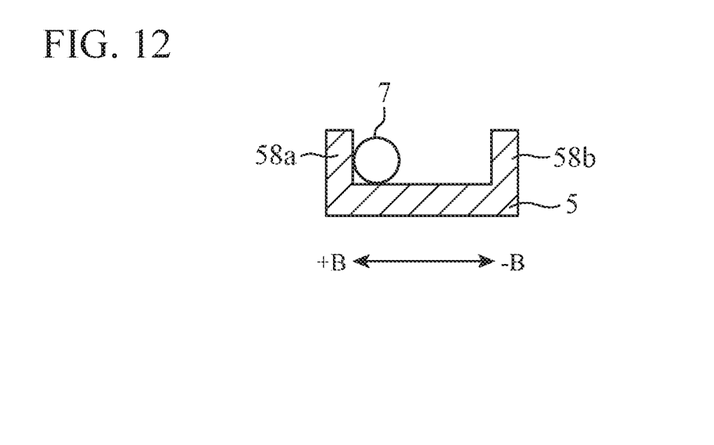
FIG. 12 is a cross-section of a sidewall and a spring of an arm according to a comparison example provided for the understanding of the shutter mechanism according to the first embodiment, take along a line equivalent to line E-E' in FIG. 9A.

FIG. 12 illustrates a comparison example of sidewalls 58a and 58b disposed on the rear face of the arm 5, provided for the understanding of the shutter mechanism 1 according to First Embodiment. FIG. 12 is a cross-section of the sidewalls 58a and 58b disposed on the arm 5 and the spring 7, taken along a line equivalent to line E-E' in FIG. 9A. When the shutter 2 resides at the closed position in the comparison example illustrated in FIG. 12, the sidewall 58a is urged against the side of the spring 7, to prevent natural vibration of the spring 7. The urging force of the spring 7 in the direction +B is applied to the arm 5 to hold the shutter 2 at the closed position. In the comparison example illustrated in FIG. 12, the spring 7 is pressed against the sidewall 58a in the direction −B, varying the direction of the load applied by the spring 7. This reduces the force holding the shutter 2 at the closed position.

When the shutter 2 resides at the open position, the sidewall 58b is pressed against the side of the spring 7, to prevent natural vibration of the spring 7. The urging force of the spring 7 in the direction −B is applied to the arm 5 to hold the shutter 2 at the open position. In the comparison example illustrated in FIG. 12, the spring 7 is pressed against the sidewall 58b in the direction +B, varying the direction of the load applied by the spring 7. This reduces the force holding the shutter 2 at the open position.

According to the configuration in the comparison example illustrated in FIG. 12 in which the spring 7 is merely configured to make a contact with the sidewall 58a or 58b, natural vibration of the spring 7 can be prevented. The direction of the load applied by the spring 7, however, varies and thereby reduces the force holding the shutter 2. In contrast, in the shutter mechanism 1 according to First Embodiment, the spring 7 is configured not only to make a contact with the protrusion 56a or 56b but also to be lifted toward the playback unit. This prevents natural vibration of the spring 7 and increases the force holding the shutter 2 at the same time.

Each top of the protrusions 56a and 56b has a flat surface. One of the flat surfaces comes into contact with the spring 7 when the shutter 2 resides at the closed position or the open position. In this way, even if a variation in the components and the assembly causes a fluctuation in the position of the spring 7 during the slide of the shutter 2, as illustrated in FIGS. 9B and 11B, the spring 7 can certainly come into contact with the flat surfaces at the tops of the protrusions 56a and 56b. The direction of the load applied by the spring 7 remains constant. Thus, the resulting shutter mechanism 1 has high reliability.

As described above, the media playback apparatus 10 according to First Embodiment includes the panel 3 having the insertion slot 31 through which a medium is to be inserted; the base 4 fixed to the rear face of the panel 3 and having a pair of base slots 41, the pivot-axle projection 42, the guide projection 43, and the cam projection 44; the shutter 2 including a pair of shafts 8 engaging with the pair of base slots 41, wherein the shutter 2 is configured to slide between a closed position and an open position in response to slide of the pair of shafts 8 through the pair of base slots 41, the shutter 2 covering the insertion slot 31 at the closed position and exposing the insertion slot 31 at the open position on a front face of the panel 3; a pair of arms 5 and 6, each arm having one end engaging with one of the pair of shafts 8 through the circular portions 52b and 63b and another end engaging with each other at the arm engaging hole 54 and the protrusion 65 in such a manner that the arms 5 and 6 move toward or away from each other; and the spring 7 attracting the arms 5 and 6 toward each other. The arm 5 is provided with a pair of protrusions 56a and 56b configured to be located between the spring 7 and the arm 6 to lift the spring 7 away from the shutter 2 at either the closed position or the open position of the shutter 2.

The spring 7 in contact with the protrusions 56a and 56b can reduce natural vibration of the spring 7 even in the case of swift shutting or opening of the shutter 2, thereby preventing generation of noise. The extension of the spring 7 increases the force causing the shutter 2 to be pressed against the panel 3. This prevents shaking of the shutter 2 even in the case of receiving external vibration, and thereby prevents noise caused by the shutter 2 hitting the panel 3.

According to First Embodiment, the faces of the protrusions 56a and 56b in contact with the spring 7 shifting in response to the slide of the shutter 2 to the closed position or the open position adjoin the tapered portions 57a and 57b having a gradually increasing height from the rear face of the arm 5. This facilitates the shift of the spring 7 onto the protrusions 56a and 56b, thereby preventing natural vibration.

According to First Embodiment, the arm 5 having the protrusions 56a and 56b is composed of resin. As a result, the noise generated during contact of the spring 7 with the protrusions 56a and 56b can be reduced because two different materials, i.e., metal and resin, come into contact.

In FIGS. 1 to 11 illustrating the first embodiment, the protrusions 56a and 56b are disposed on the arm 5. Alternatively, the protrusions 56a and 56b may be disposed on the other arm 6.

Figure 13A:
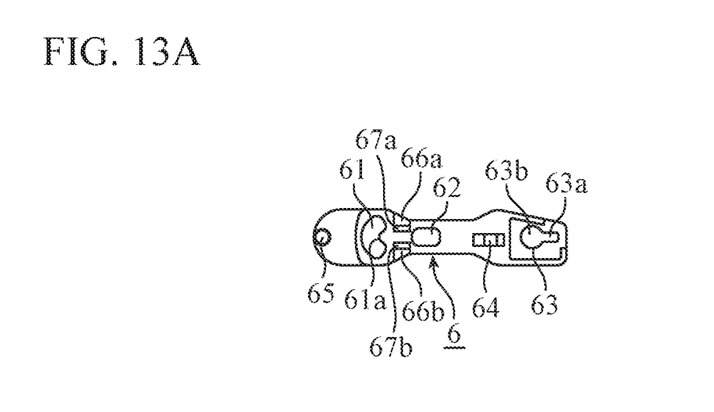
FIG. 13A is a rear view of an arm and FIG. 13B is a plan view.
Figure 13B:
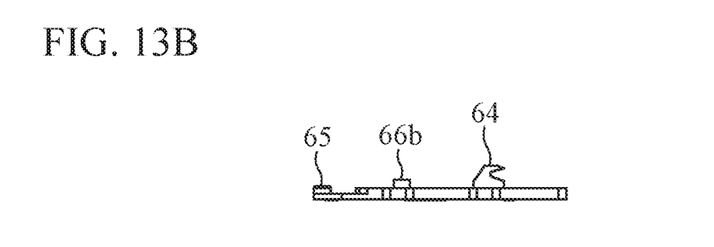

FIG. 13 illustrates a modification of protrusions 66a and 66b disposed on the arm 6. FIG. 13A is a rear view of the arm 6, and FIG. 13B is a plan view of the arm 6. When the shutter 2 resides at the closed position, the protrusion 66a on the rear face of the arm 6 gets between the spring 7 and the rear face of the arm 6 and lifts the spring 7 away from the shutter 2. When the shutter 2 resides at the open position, the protrusion 66b also on the rear face of the arm 6 gets between the spring 7 and the rear face of the arm 6 and lifts the spring 7 away from the shutter 2.

The inner faces of the protrusions 66a and 66b may have tapered portions 67a and 67b, respectively having a gradually increasing height from the rear face of the arm 6.

Alternatively, the arm 5 may include the protrusions 56a and 56b, and the arm 6 may include the protrusions 66a and 66b. In such a case where the protrusions 56a and 56b and the protrusions 66a and 66b are disposed on the arms 5 and 6, respectively, the spring 7 can be certainly lifted away from the shutter 2 even in the case of variation in the components and/or the assembly.

Any component according to the embodiment may be modified or omitted within the scope of the invention.

For example, the shutter mechanism 1 may be used in various apparatuses requiring opening and closing of a shutter, besides the media playback apparatus 10. In such a case, the shutter mechanism 1 should at least include a base 4 having two base slots 41, a pivot-axle projection 42, a guide projection 43, and a cam projection 44; a shutter 2 including two shafts 8 engaging with the two base slots 41, the shutter 2 sliding between two positions corresponding to open and closed position on the base 4 in response to the shafts 8 sliding through the base slots 41; arms 5 and 6 having first ends engaging with the shafts 8 and other ends engaging with each other such that the arms 5 and 6 move toward or away from each other; and a spring 7 pulling the arms 5 and 6 toward each other. At least the arm 5 includes the protrusions 56a and 56b configured to be located between the spring 7 and the arm 5 to lift the spring 7 away from the shutter 2 at either one of the two positions of the shutter 2. Similar to the configuration described above, this configuration can also prevent vibration of the spring 7 and the shutter 2, and thereby prevents generation of noise.

INDUSTRIAL APPLICABILITY

The shutter mechanism according to the present invention prevents vibration of the spring and the shutter. Thus, the shutter mechanism is suitable for apparatuses, such as vehicles, to be used in a vibrating environment.

REFERENCE SIGNS LIST

1: shutter mechanism, 2: shutter, 3: panel, 4: base, 5: arm, 6: arm, 7: spring, 8: shaft, 9: screw, 10: media playback apparatus, 31: opening, 32: guide slot, 41: base slot, 42: pivot-axle projection, 43: guide projection, 44: cam projection, 45: slide portion, 46: large diameter portion, 47: arcuate slot, 51: pivot-axle hole, 52: shaft engaging hole, 52*a*: rectangular portion, 52*b*: circular portion, 53: spring hook, 54: arm engaging hole, 55: hook, 56*a* and 56*b*: protrusion, 57*a* and 57*b*: tapered portion, 58*a* and 58*b*: sidewall, 61: cam slot, 62: engage hole, 63: shaft engaging hole, 63*a*: rectangular portion, 63*b*: circular portion, 64: spring hook, 65: protrusion, 66 and 66*b*: protrusion, 67*a* and 67*b*: tapered portion, 81: cylindrical portion, 82: intermediate diameter portion, 83: small diameter portion, 84: end segment

The invention claimed is:

1. A media playback apparatus comprising:
   a panel having an insertion slot through which a medium is to be inserted;
   a base fixed to a rear face of the panel and comprising a pair of base slots, a pivot-axle projection, a guide projection, and a cam projection;
   a shutter comprising a pair of shafts engaging with the pair of base slots, wherein the shutter is configured to slide between a closed position and an open position in response to slide of the pair of shafts through the pair of base slots, the shutter covering the insertion slot at the closed position and exposing the insertion slot at the open position on a front face of the panel;
   a pair of arms, each arm having one end engaging with one of the pair of shafts and another end engaging with each other in such a manner that the arms move toward or away from each other; and
   a spring attracting the arms toward each other,
   wherein either or both of the pair of arms are provided with a pair of protrusions configured to be located between the spring and the corresponding arm to lift the spring away from the shutter at either the closed position or the open position of the shutter.

2. The media playback apparatus according to claim 1, wherein each protrusion has a contact face to come into contact with the spring shifting in response to the slide of the shutter to the closed position or the open position, the contact face tapering so as to gradually increase in height from the arm.

3. The media playback apparatus according to claim 1, wherein the pair of protrusions is made from resin.

4. A shutter mechanism comprising:
   a base comprising a pair of base slots, a pivot-axle projection, a guide projection, and a cam projection;
   a shutter comprising a pair of shafts engaging with the pair of base slots, wherein the shutter is configured to slide between two positions on the base in response to slide of the pair of shafts through the pair of base slots;
   a pair of arms, each arm having one end engaging with one of the pair of shafts and another end engaging with each other in such a manner that the arms move toward or away from each other; and
   a spring attracting the arms toward each other,
   wherein either or both of the pair of arms are provided with a pair of protrusions so as to be located between the spring and the corresponding arm to lift the spring away from the shutter at either of the two positions of the shutter.

* * * * *